United States Patent
Andrieu et al.

(10) Patent No.: US 9,514,996 B2
(45) Date of Patent: Dec. 6, 2016

(54) PROCESS FOR FABRICATING SOI TRANSISTORS FOR AN INCREASED INTEGRATION DENSITY

(71) Applicant: Commissariat a L'Energie Atomique et aux Energies Alternatives, Paris (FR)

(72) Inventors: Francois Andrieu, Saint-Ismier (FR); Denis Rideau, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/099,892

(22) Filed: Apr. 15, 2016

(65) Prior Publication Data

US 2016/0307809 A1    Oct. 20, 2016

(30) Foreign Application Priority Data

Apr. 16, 2015   (FR) ..................... 15 53376

(51) Int. Cl.
| | | |
|---|---|---|
| H01L 21/00 | (2006.01) | |
| H01L 21/84 | (2006.01) | |
| H01L 29/06 | (2006.01) | |
| H01L 21/306 | (2006.01) | |
| H01L 29/66 | (2006.01) | |

(52) U.S. Cl.
CPC ......... *H01L 21/84* (2013.01); *H01L 21/30604* (2013.01); *H01L 29/0649* (2013.01); *H01L 29/6653* (2013.01); *H01L 29/6656* (2013.01); *H01L 29/66553* (2013.01)

(58) Field of Classification Search
None
See application file for complete search history.

(56) References Cited

U.S. PATENT DOCUMENTS

| | | |
|---|---|---|
| 2012/0299080 A1 | 11/2012 | Dennard et al. |
| 2013/0001706 A1 | 1/2013 | Haran et al. |
| 2013/0089978 A1 | 4/2013 | Noel et al. |
| 2014/0027818 A1 | 1/2014 | Asenov |

FOREIGN PATENT DOCUMENTS

| | | |
|---|---|---|
| EP | 2 573 808 A1 | 3/2013 |
| WO | WO 2012/161859 A1 | 11/2012 |

OTHER PUBLICATIONS

French Preliminary Search Report issued Feb. 18, 2016 in French Application 15 53376, filed Apr. 16, 2015 (with English Translation of Categories of Cited Documents).

(Continued)

*Primary Examiner* — Marvin Payen
(74) *Attorney, Agent, or Firm* — Oblon, McClelland, Maier & Neustadt, L.L.P.

(57) ABSTRACT

A process for fabricating field-effect transistors, including providing a first semiconductor band surmounted with a first semiconductor layer; providing a second semiconductor band surmounted with a second semiconductor layer; providing a buried insulating layer; providing a deep trench isolation passing through the buried insulating layer and isolating the first semiconductor band from the second semiconductor band; etching the first semiconductor band so as to form a first row of semiconductor islands; etching the second semiconductor band so as to form a second row of semiconductor islands; and forming sacrificial gates on the first semiconductor layer and on the second semiconductor layer.

18 Claims, 12 Drawing Sheets

(56) References Cited

OTHER PUBLICATIONS

F. Andrieu et al. "Strain and Layout Management in Dual Channel (sSOI Substrate, SiGe Channel) Planar FDSOI MOSFETs", 2014 4$^{th}$ European Solid State Device Research Conference (ESSDERC), IEEE, 2014, 4 pages.
K. Cheng et al. "High Performance Extremely Thin SOI (ETSOI) Hybrid CMOS with Si Channel NFET and Strained SiGe Channel PFET", 2012 IEEE International Electron Devices Meeting (IEDM), 2012, 4 pages.
Zhongda Li et al. "Isulation Methods for GaN Lateral MOS-Channel HEMTs", Lester Eastman Conference on High Performance Devices (LEC), 2012, 3 pages.
L. Grenouillet et al. "UTBB FDSOI Transistors with Dual STI for a Multi-V, Strategy at 20nm Node and Below", 2012 IEEE International Electron Devices Meeting (IEDM), 2012, 4 pages.
Jean-Pierre Colinge et al. "Nanowire Transistors without Junctions", Nature Technology, vol. 5, Mar. 2010, 5 pages.

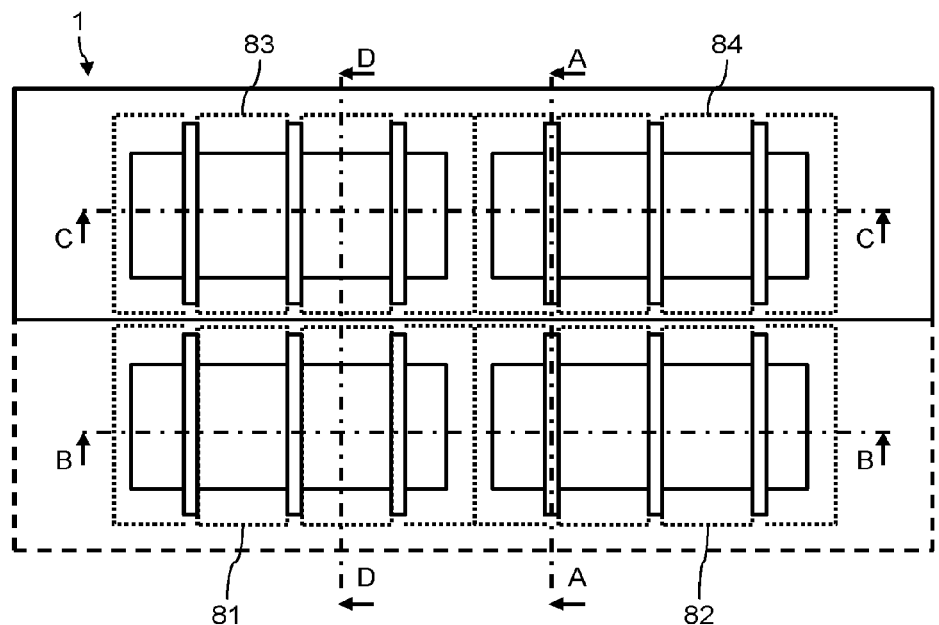
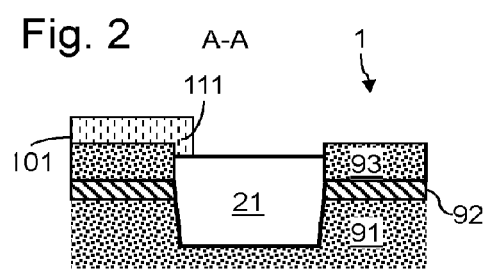
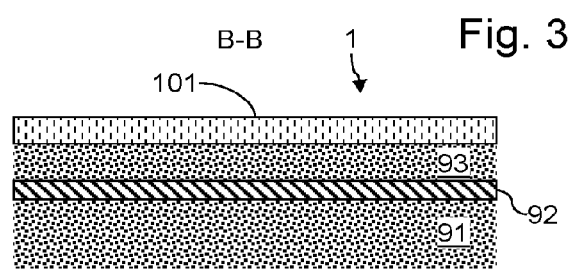
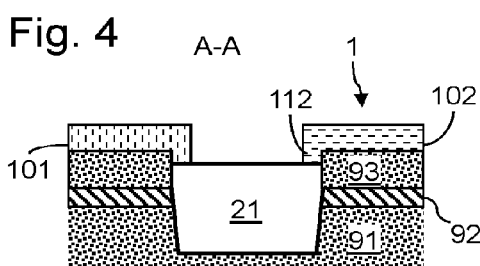
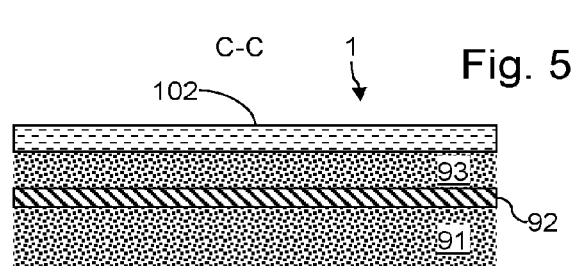

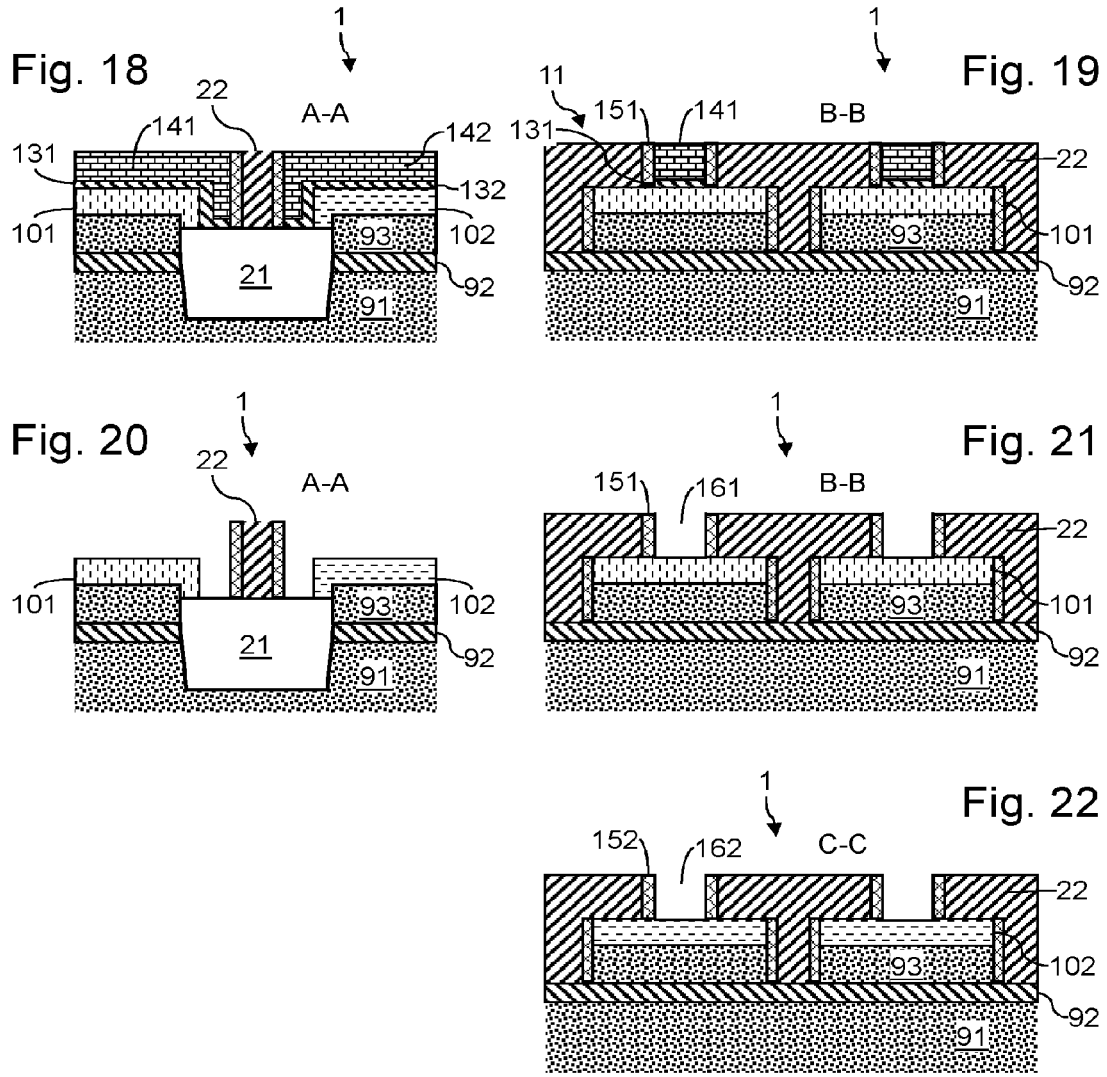

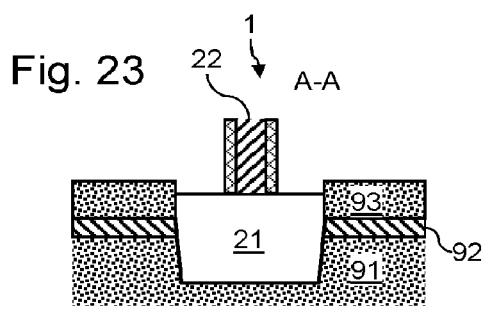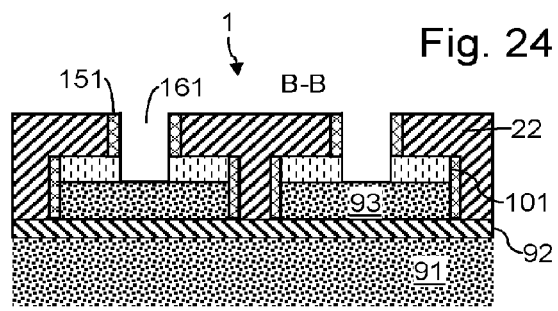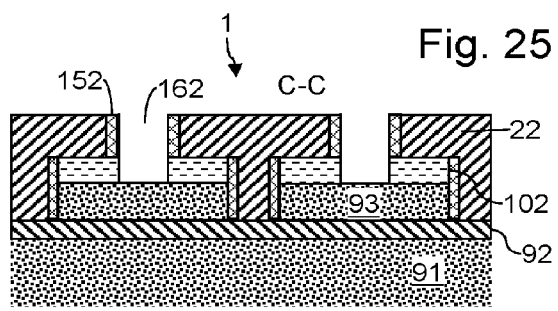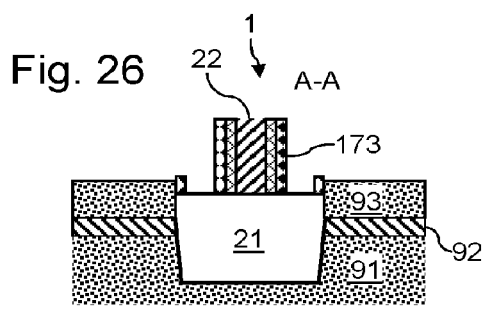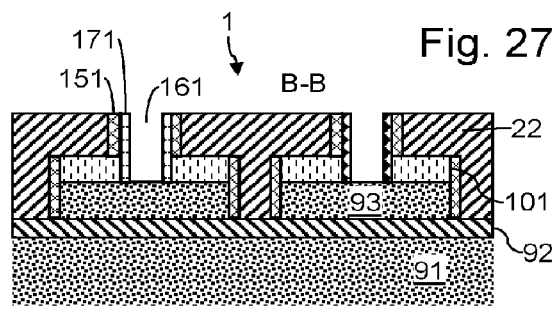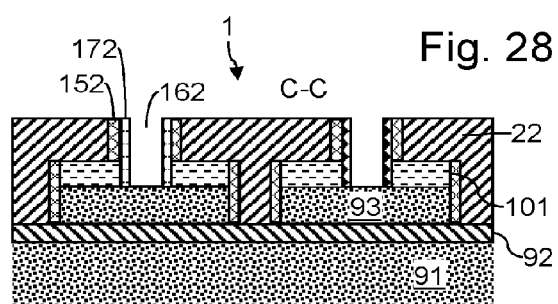

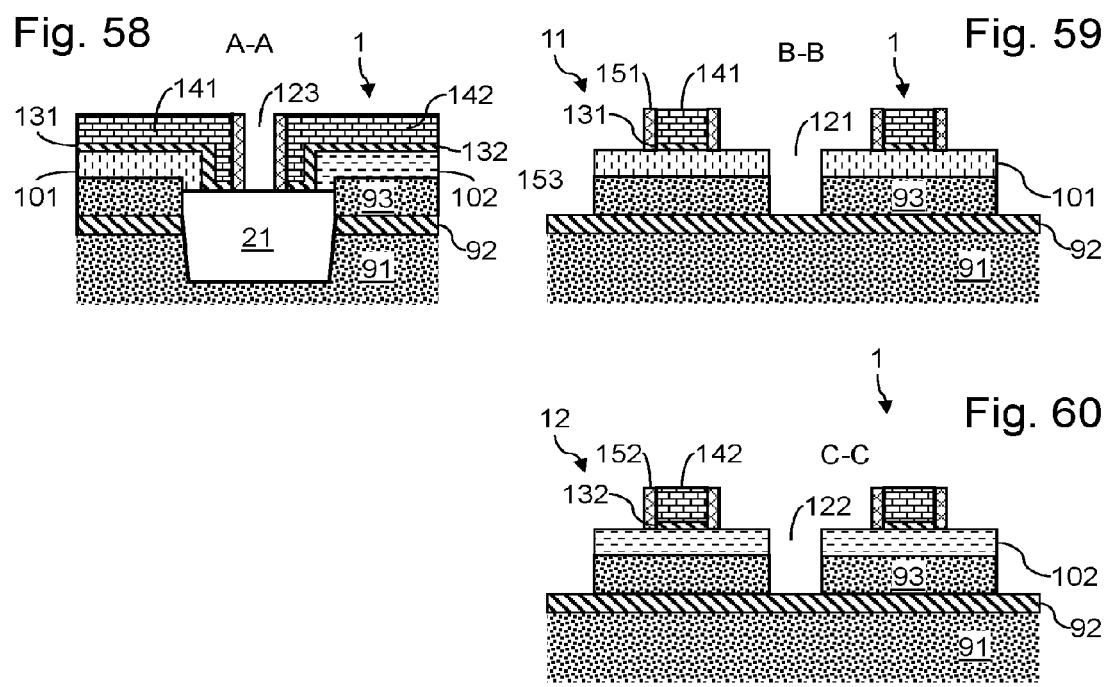

PROCESS FOR FABRICATING SOI TRANSISTORS FOR AN INCREASED INTEGRATION DENSITY

The invention relates to field-effect transistors produced in a silicon-on-insulator substrate, and in particular to the fabrication processes of such transistors.

Document U.S. Pat. No. 8,691,650 describes a process for fabricating MOSFET transistors on an SOI substrate. The process is initiated starting with a bulk semiconductor substrate surmounted with a BOX buried insulating layer surmounted with what is referred to as an active semiconductor layer or SOI (for silicon-on-insulator) layer.

First, trench isolations are formed through the SOI layer and the BOX layer, in order to isolate various zones, for example rows of nMOS transistors from rows of pMOS transistors. Mesa isolations are then formed between the various transistors of a given zone.

A sacrificial gate electrode is formed on the SOI layer and typically comprises a dielectric layer surmounted with the sacrificial gate itself. In a subsequent step, spacers are formed on either side of the sacrificial gate electrode. In a subsequent step, junctions are formed with a channel located under the sacrificial gate electrode. The junctions are formed with a doped source and drain. The doped source and drain are produced by epitaxial deposition of a doped material on the SOI layer on either side of the sacrificial gate, then by diffusion by annealing of the dopants of each deposition into the zone of the SOI layer located under this deposition and laterally under the spacers.

Next, an insulating layer is deposited so as to cover the sacrificial gate electrode. The insulating layer then undergoes a planarizing polish that is stopped when the sacrificial gate is reached.

Next, the sacrificial gate and the dielectric layer of the sacrificial gate electrode are removed by selective etching. The selective etching is prolonged so as to etch a recess in the SOI layer between the spacers.

Silicon is deposited epitaxially in the recess to form a channel. A gate stack is then formed by depositing a high-k dielectric material, then by depositing a gate metal on the high-k material.

In principle, such a process allows a smaller channel thickness to be obtained, in order to improve short-channel effects, while preserving under the spacers a thickness of SOI layer sufficient to obtain a good compromise between the on-state resistance of the transistor and gate/drain capacitance.

When the thickness of the SOI layer is smaller than 6 nm, it has been observed that the epitaxial depositions produced on this SOI layer to form the source and drain may have many defects, such as an increased roughness or the formation of nodules separated by dewetting. These defects are amplified when the epitaxial depositions are followed by high-temperature processing steps.

The process thus described therefore makes it possible to preserve an SOI thickness sufficient to produce epitaxial depositions exempt of defects while benefiting from the advantages of a channel having a thickness smaller than 6 nm.

However, such a fabrication process has drawbacks. Thus, the epitaxial deposition forming the sources and drains may overrun onto the trench isolations. To avoid creating short-circuits above the trench isolations, between the epitaxial depositions of these various zones, such a process either requires relatively wide trench isolations to be produced, or bevels or facets to be produced in the epitaxial depositions bordering the trench isolations, in order to prevent coverage of the trench isolation with these epitaxial depositions.

Wide trench isolations affect the integration density of the transistors, in particular for technological nodes of small size. Typically, for the 20 nm node for example, the typical width of the trench isolations is 70 nm. In practice, the formation of bevels or facets in the epitaxial depositions decreases the contact area of the sources and drains and limits the doping density achievable by epitaxy, thereby limiting the on-state current of the transistors in particular for technological nodes of small size.

There is therefore a need for a fabrication process solving one or more of these drawbacks. The invention thus relates to a process for fabricating field-effect transistors, such as defined in the appended claim 1.

The invention also relates to the variants thereof, such as defined in the appended dependent claims. Those skilled in the art will understand that each of the features of the dependent claims may be combined independently with the features of claim 1, without however constituting an intermediate generalisation.

Other features and advantages of the invention will become more clearly apparent from the description that is given thereof below, by way of nonlimiting indication, with reference to the appended drawings, in which:

FIG. 1 is a top view of an integrated circuit including various adjoined transistors;

FIGS. 2 to 39 illustrate various steps of an exemplary process for fabricating field-effect transistors according to a first embodiment of the invention;

FIGS. 43 to 60 illustrate various steps of an exemplary process for fabricating field-effect transistors according to a second embodiment of the invention.

Figure 6:
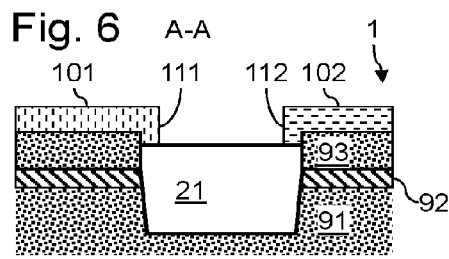

The dimensions illustrated are solely intended to facilitate comprehension and are not to scale. FIG. 1 is a schematic top view of an integrated circuit 1. The integrated circuit 1 includes:

a row of nMOS transistors including two zones 81 and 82 each including a plurality of nMOS transistors; and a row of pMOS transistors including two zones 83 and 84 each including a plurality of pMOS transistors.

Prior to the step illustrated in FIG. 2, a semiconductor substrate 91 is provided. The substrate 91 is for example a substrate based on silicon, typically a p-doped silicon substrate with a doping concentration lower than or equal to $10^{16}$ cm$^{-3}$ or than $3 \times 10^{15}$ cm$^{-3}$. The fabrication process is applied to SOI type transistors. All of the transistors will then be formed plumb with a buried insulating layer 92, for example made of an oxide such as silicon oxide. The buried insulating layer 92 separates the substrate 91 from an upper semiconductor layer 93 called the active layer.

The buried insulating layer 92 is advantageously an UTBOX (ultra-thin buried oxide) layer, and thus has a thickness typically smaller than 50 nm and for example comprised between 10 and 30 nm.

The provided active layer 93 may include various semiconductor alloys. For example, the active layer 93 may include bands of a first alloy intended to form the channel of the nMOS transistors, and bands of a second alloy intended to form the channel of the pMOS transistors. The alloy chosen for the channel of the nMOS transistors is for example the same semiconductor as the substrate 91, SiC or a III-V semiconductor compound (for example GaAs, InP or $In_{1-x}Ga_xAs$). The alloy chosen for the channel of the pMOS transistors is for example SiGe or SiGeC. The active layer 93 for example has a thickness comprised between 2 and 20 nm, preferably between 3 and 15 nm, and typically of 5 nm. The thickness of the active layer 93 is generally chosen to be approximately equal to a quarter of the minimum gate length of the transistor to be formed. The formation of the active layer 93 is known per se to those skilled in the art and will not be detailed further.

The provided substrate 91 includes trench isolations 21, usually designated by the acronym STIs. The trench isolations 21 allow the rows of transistors to be isolated at the level of their active layer 93. The trench isolations 21 formed thus extend through the active layer 93 as far as the buried insulating layer 92. In the illustrated example, the trench isolations 21 pass through the buried insulating layer 92 and extend into the substrate 91, for example to a depth typically comprised between 5 and 500 nm. The trench isolations 21 typically have a width at least equal to 100 nm level with the buried insulating layer 92. The trench isolations 21 are typically formed from oxide, for example from silicon oxide.

The formation process of the trench isolations 21 is known per se to those skilled in the art. The formation process of the trench isolations 21 may for example comprise a step of depositing a hard mask made of an oxide or nitride, followed by a lithography step defining the pattern of the trench isolations 21, followed by a step of etching grooves in which the trench isolations 21 will be formed, followed by a step of removing the lithography resist, followed by an oxidising step and a step of depositing oxide in the grooves, followed by an annealing step for densifying the deposited oxide, followed by a chemical-mechanical polishing step (usually designated by the acronym CMP), followed by a step of removing the hard mask.

The formation of the trench isolations 21 (especially the etching and the thermal budget implemented during the filling of the trench) may advantageously allow strains at the edge of a band of the active layer 93 to be relaxed when the active layer 93 is pre-strained. A band of active layer 93 intended for pMOS transistors may typically be formed from SiGe compressively pre-strained along two axes. A band of active layer 93 intended for nMOS transistors may typically be made of silicon tensilely pre-strained along two axes.

The delivered substrate 91 at this stage does not include STI trench isolations separating various zones of a given row of transistors. An isolation between the transistors of a given row is formed in a subsequent step of the fabrication process.

The fabrication process may advantageously be applied to FDSOI transistors integrating a doped and biased ground plane (also called a back gate in the literature). The steps of doping the ground planes will not be detailed further. The connection and doping of the ground planes are not illustrated for the sake of simplicity. The ground planes may be located in wells (not illustrated) in the substrate 91. The channel of the formed FDSOI transistors is generally lightly doped. (typically $10^{15}$ cm$^{-3}$).

With a buried insulating layer 92 of the UTBOX type, the threshold voltage of the FDSOI transistors formed on this layer 92 is, as is known per se, influenced by the doping type and the biasing of ground planes located under this layer 92. Specifically, these ground-plane parameters allow the electrostatic properties of the channel of the transistors to be controlled.

FIG. 2 is a transverse cross-sectional view of the integrated circuit 1 through two rows of transistors. FIG. 3 is a transverse cross-sectional view level with a row of nMOS transistors to be formed. A semiconductor layer 101 is formed on a band of the active layer 93 of a row of nMOS transistors to be formed. The semiconductor layer 101 may be formed by epitaxial growth on the active layer 93 (or for example by implanting dopants into a semiconductor layer formed on the active layer 93), while masking the bands of active layer 93 of the rows of pMOS transistors to be formed. The semiconductor layer 101 may for example be formed from Si, SiCP, Si doped with arsenic or phosphorus, strained Si, InGaAs, InAs or InSb. The semiconductor layer 101 advantageously has a thickness comprised between 2 and 30 nm. The semiconductor layer 101 advantageously comprises an overrun 111 onto the trench isolation 21. By preserving an overrun onto the trench isolation 21 in the transistors obtained at the end of the fabrication process, the drain or source including this overrun has a lower contact resistance.

FIG. 4 is a transverse cross-sectional view of the integrated circuit 1 through two rows of transistors. FIG. 5 is a transverse cross-sectional view level with a row of pMOS transistors to be formed. A semiconductor layer 102 is formed on a band of the active layer 93 of a row of pMOS transistors to be formed. The semiconductor layer 102 may be formed by epitaxial growth on the active layer 93 (or for example by implanting dopants into a semiconductor layer formed on the active layer 93), while masking the bands of active layer 93 of the rows of nMOS transistors to be formed. The semiconductor layer 102 may for example be formed from Si or from SiGeB or from SiGe or Ge or GeSn or InSb or from B-doped Si. The semiconductor layer 102 advantageously has a thickness comprised between 2 and 30 nm. The semiconductor layer 102 advantageously comprises an overrun 112 onto the trench isolation 21. By preserving an overrun onto the trench isolation 21 in the transistors obtained at the end of the fabrication process, the drain or source including this overrun has a lower contact resistance.

Of course, the formation of the layer 102 may precede the formation of the layer 101. The material of the semiconductor layers 101 and 102 is intended to form raised sources and drains for the various transistors. The materials of the semiconductor layers 101 and 102 typically have an electrical resistivity lower than that of the band of active layer 93 on which they are respectively formed, in order to decrease the access resistance of the transistors level with their drain and their source. The materials of the semiconductor layers 101 and 102 may typically be alloys or semiconductors in which the doping concentration is very much higher than that of the band of active layer 93 on which they are respectively formed. The semiconductor layers 101 and 102 may be the object of native doping, subsequent steps of implanting dopants, and/or annealing steps that are not detailed here. The diffusion of dopants, from the layer 101 or the layer 102 into the zone of the active layer 93 intended to form a channel, prior to the formation of the gates, possibly improves the operation of an FDSOI transistor according to certain studies.

Figure 7:
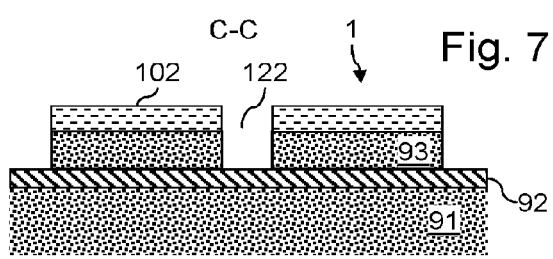
Figure 8:
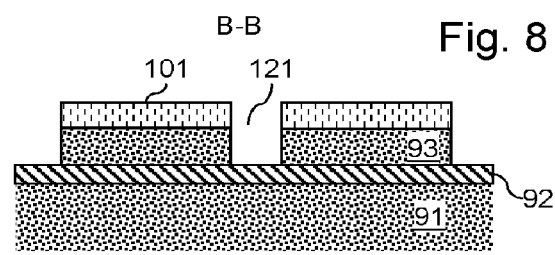

At the stage illustrated in FIGS. 6 to 8, a mesa type isolation has been produced between the transistors to be formed in each of the zones 81 to 84. A mesa type isolation process usually includes defining various islands for the various transistors, by etching through the active layer 93 to at least as far as the buried insulating layer 92, as is known per se by those skilled in the art. Such etching is typically implemented by means of masking steps known per se by those skilled in the art. For the sake of simplicity, the islands illustrated in FIGS. 6 to 8 each include a single transistor, whereas the islands illustrated in FIG. 1 each include three transistors.

The islands intended to form nMOS transistors in a row are separated by grooves 121. The islands intended to form pMOS transistors in an adjacent row are separated by grooves 122. The width of the grooves 121 and 122 formed is advantageously at most 90 nm, preferably at most 45 nm, and advantageously a maximum of 30 nm. The grooves 121 and 122 formed here stop before passing through the buried insulating layer 92; the grooves 121 and 122 are necessarily shallower than the trench isolation 21. Such isolations are generally sufficient, the wells of a given row generally sharing a given well/ground plane and a given bias. The isolation between the various islands formed then especially rests on the buried insulating layer 92.

Figure 9:
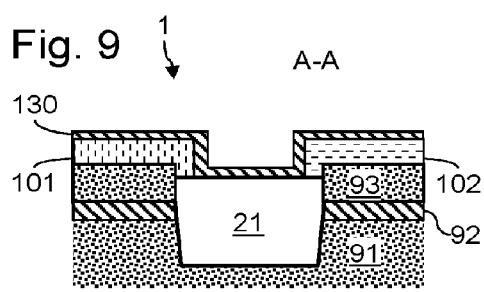
Figure 10:
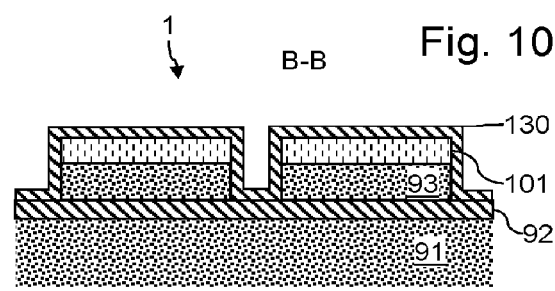

At the stage illustrated in FIGS. 9 and 10, the formation of the sacrificial gates is initiated. Here, a dielectric layer 130 is deposited or grown on the wafer scale. Processes for depositing the dielectric layer 130 are known per se to those skilled in the art, for example PECVD (plasma-enhanced chemical vapour deposition) or LPCVD (low-pressure chemical vapour deposition) may be used. The dielectric layer 130 thus covers the islands and the various faces of the grooves 121 and 122. The layer 130 is also deposited on the upper face of the trench isolation 21 between the row of nMOS transistors and the row of pMOS transistors. The dielectric layer 130 may for example be produced in the form of a thin oxide layer (for example of $Si_xO_yH_z$). The dielectric layer 130 may for example have a thickness comprised between 1 and 20 nm.

Figure 11:
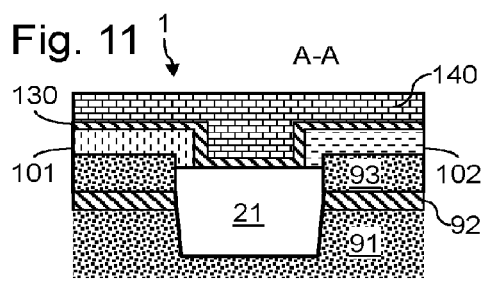
Figure 12:
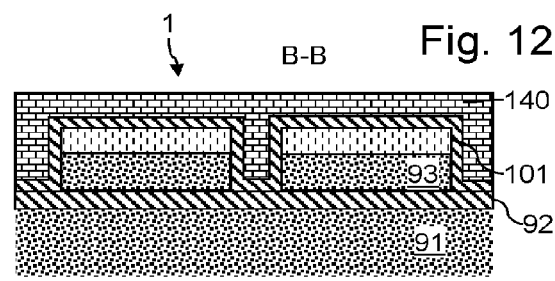

At the stage illustrated in FIGS. 11 and 12, the formation of the sacrificial gates has progressed. Here, a layer 140 has been deposited on the wafer scale. The layer 140 may be produced from a single material (for example silicon nitride $Si_xN_yH_z$) or may include a superposition of various layers, for example a layer of silicon nitride $Si_xN_yH_z$ on a thin oxide layer $Si_xO_yH_z$, or a cap of nitride $Si_xN_yH_z$ on polysilicon. Processes for depositing the layer 140 are known per se to those skilled in the art. The layer 140 here fills the grooves 121 and 122.

The height of the stack of the layers 130 and 140 formed on the layers 101 and 102 is advantageously comprised between 10 and 200 nm, and preferably between 15 and 80 nm.

Figure 13:
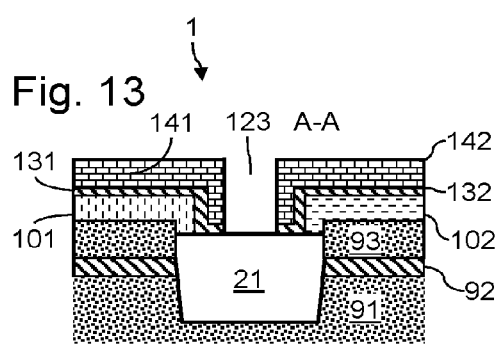
Figure 14:
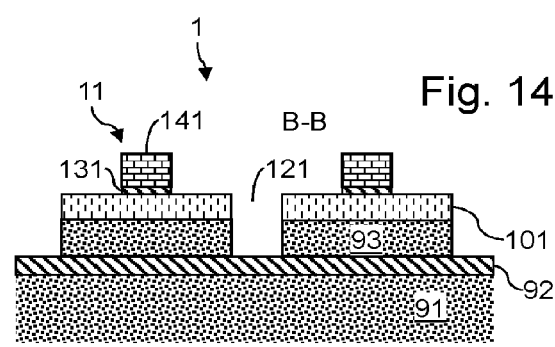

At this stage illustrated in FIGS. 13 and 14 the patterns of the sacrificial gates have been defined on the various islands in a way known per se. The definition of the patterns of the sacrificial gates is known per se by those skilled in the art and may for example be carried out by photolithography. The definition of the patterns of the sacrificial gates induces the removal of the layers 130 and 140 from the grooves 121 and 122, until the active layer 93 is reached and passed through. The definition of the sacrificial gates also induces the removal of the layers 130 and 140 between the adjacent rows of transistors, so as to form a groove 123 reaching the trench isolation 21.

Sacrificial gates 11 are thus obtained for the nMOS transistors by superposing layers 131 and 141 issued from the layers 130 and 140, respectively. Sacrificial gates 12 (illustrated in FIG. 17) are also obtained for the pMOS transistor by superposing layers 132 and 142 issued from the layers 130 and 140, respectively.

Figure 15:
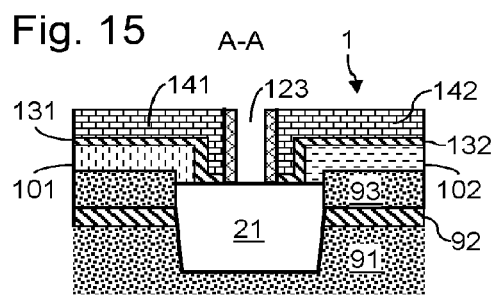
Figure 16:
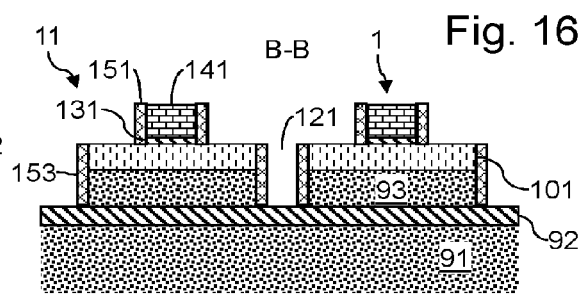
Figure 17:
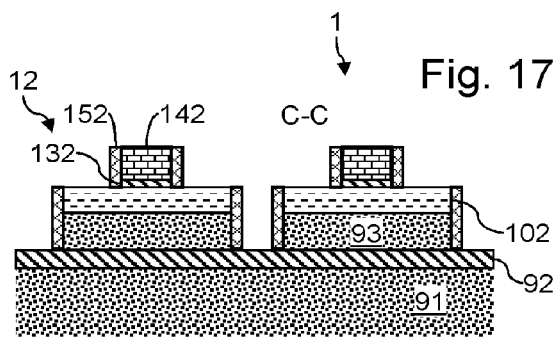

At the stage illustrated in FIGS. 15 to 17, a dielectric layer has been deposited, typically by wafer-scale deposition. This dielectric layer is for example deposited by an ALD (atomic layer deposition) process. This dielectric layer is especially deposited on the lateral faces of the various sacrificial gates 11 and 12, and on the lateral faces of the grooves 121, 122 and 123. This dielectric layer is for example produced from silicon nitride $Si_xN_yH_z$, from silicon oxide $SiO_xH_y$, or from any other material suitable for forming spacers for gate stacks, a low-k material such as SiCBN or SiOCN for example. This dielectric layer may be deposited conformally so as to have the same thickness on the vertical surfaces and on the horizontal surfaces. The thickness of this dielectric layer formed on the vertical surfaces is for example comprised between 3 and 7 nm, typically 5 nm.

By etching, this dielectric layer has been removed so as to expose the layers 101 and 102 on either side of the sacrificial gates 11 and 12, so as to expose the buried insulating layer 92 at the bottom of the grooves 121 and 122 and so as to expose the trench isolation 21 at the bottom of the grooves 123. Spacers 151 and 152 are preserved on the lateral faces of the sacrificial gates 11 and 12, respectively, and spacers 153 are preserved on the lateral faces of the islands in the grooves 121 and 122. Such a removal of this dielectric layer so as to obtain these spacers is for example implemented with an anisotropic etch.

At the stage illustrated in FIGS. 18 and 19, the integrated circuit 1 has been encapsulated in an insulating layer 22. The encapsulation is typically carried out on the wafer scale by means of a silicon oxide of SiCO or of SiCOH. A chemical-mechanical polish has here then been carried out and been stopped on reaching the sacrificial gates. The insulating layer 22 here fills the grooves 121, 122 and 123.

At the stage illustrated in FIGS. 20 to 22, the sacrificial gates are removed until the layers 101 and 102 are reached. The sacrificial electrodes are typically removed by means of a selective etch, in a way known per se. The silicon nitride is for example removed by wet chemical etching with hot (for example between 150 and 160° C.) $H_3PO_4$. Grooves 161 are then formed between the spacers 151 and grooves 162 are then formed between the spacers 152.

At the stage illustrated in FIGS. 23 to 25, the grooves 161 and 162 are deepened by etching of the layers 101 and 102. In the illustrated example, the etching of the layers 101 and 102, in the grooves 161 and 162 respectively, continues until the active layer 93 is reached. Thus, the thickness of the sources and drains of the transistors formed will possibly be large, in order to avoid any risk of dewetting, while a thinner zone of active layer 93 is nonetheless obtained at the bottom of the grooves 161 and 162, with a view to forming the channels of the transistors.

The active layer 93 may advantageously be used as an etch stop layer during the etching of the layers 101 and 102. The layers 101 and 102 may for example be etched by chemical etching with TMAH (tetramethylammonium hydroxide) or $NH_4OH$.

At the stage illustrated in FIGS. 26 to 28, spacers 171 are formed in the grooves 161, and spacers 172 are formed in the grooves 162. Spacers 173 are also formed between the rows of transistors, above the trench isolations 21.

The spacers 171 to 173 may for example be formed by the following process. A dielectric layer may be deposited, typically by wafer-scale deposition. This dielectric layer is for example deposited by an ALD (atomic layer deposition) process. This dielectric layer is especially deposited on the lateral faces of the grooves 161 and 162. This dielectric layer is for example produced from silicon nitride $Si_xN_yH_z$, from silicon oxide $SiO_xH_y$, or from any other material suitable for forming spacers for gate stacks, a low-k material such as SiCBN or SiOCN for example. This dielectric layer may be deposited conformally so as to have the same thickness on the vertical surfaces and on the horizontal surfaces. The thickness of this dielectric layer formed on the vertical surfaces is for example comprised between 3 and 7 nm, typically 5 nm. By etching, it is possible to remove this dielectric layer so as to expose the active layer 93 at the bottom of the grooves 161 and 162, and so as to expose the trench isolation 21 beside the spacers 173.

Advantageously, an annealing step may be implemented, in order to diffuse dopants from the layers 101 and 102 into the active layer 93, level with the sources and drains to be formed. It is also possible to envisage using the thermal budget implemented in subsequent steps of forming gate stacks to achieve such a diffusion.

Figure 29:
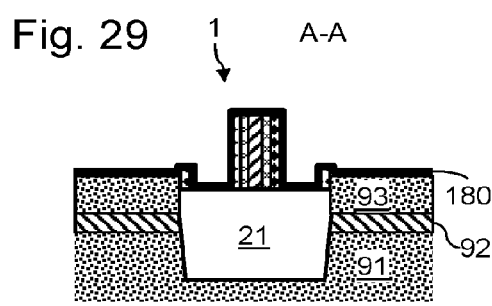
Figure 30:
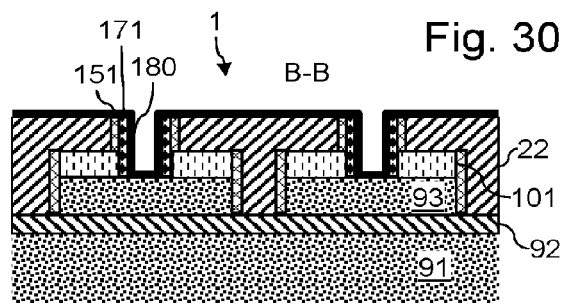
Figure 31:
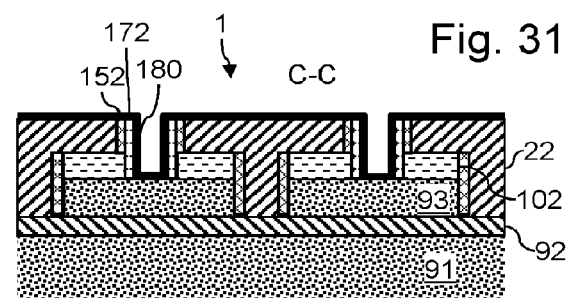

At the stage illustrated in FIGS. 29 to 31, a gate insulating layer 180 has been deposited. The insulating layer 180 is here produced on the wafer scale. The insulating layer 180 thus covers the insulator 22, the lateral walls and the bottom of the grooves 161 and 162. The grooves 161 and 162 are not entirely filled with the gate insulating layer 180. The gate insulating layer 180 may for example be deposited by an ALD process, thereby allowing a uniform thickness to be obtained on the vertical faces and horizontal faces.

The material chosen for the gate insulating layer 180 is known per se by those skilled in the art. The material of the gate insulating layer 180 may for example be a high-k or Hk material (the expression "high-k material" usually designates a material the relative dielectric constant of which is at least equal to 6). The material of the gate insulating layer 180 may for example be $HfO_2$. Other materials may be used for the gate insulating layer 180, among which, nonlimitingly, HfSiON or HfAlO or $Al_2O_3$.

Figure 32:
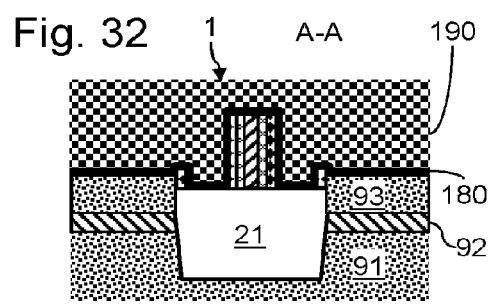
Figure 33:
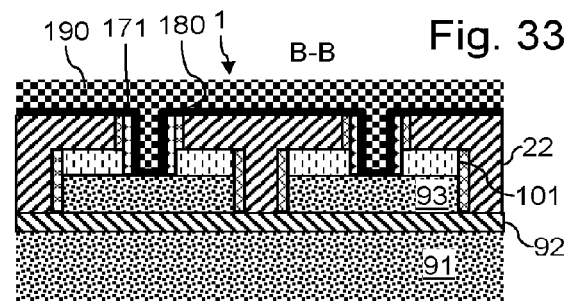

At the stage illustrated in FIGS. 32 and 33, a conductor layer 190 is formed on the gate insulating layer 180. The conductor layer 190 covers the upper face of the gate insulating layer 180 and fills the grooves 161 and 162. The material chosen for the layer 190 may for example be TiN or TaN. This material is for example chosen to have a work function suitable for the gate of the transistors. Different conductors will possibly be used for the gates of the nMOS and pMOS transistors.

Figure 34:
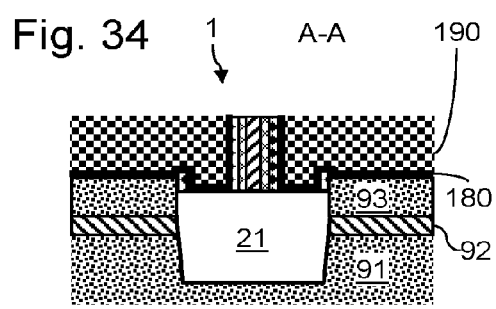
Figure 35:
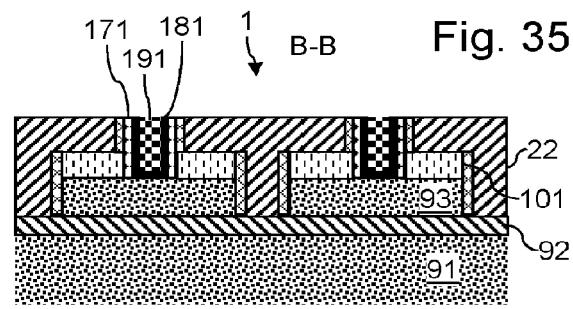
Figure 36:
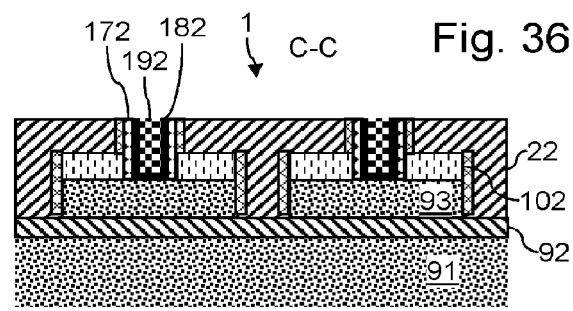

At the stage illustrated in FIGS. 34 to 36, a chemical-mechanical polish is carried out to remove the layers 180 and 190 from the upper surface of the insulating layer 22. Each nMOS transistor then includes a gate insulating layer 181 on which a gate electrode 191 has been formed. Each pMOS transistor then includes a gate insulating layer 182 on which a gate electrode 192 has been formed.

Figure 37:
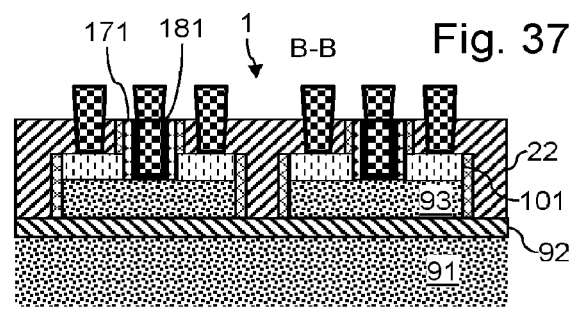
Figure 38:
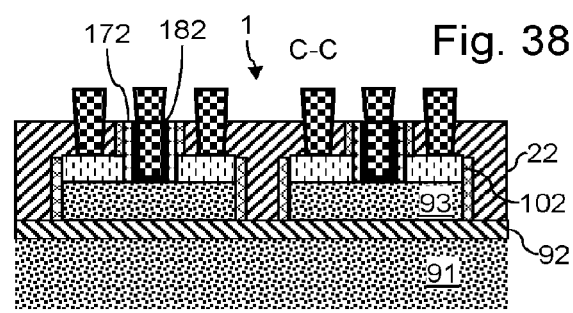

At the stage illustrated in FIGS. 37 and 38, metal interconnect contacts have been formed in a way known per se for the source, drain and gate of each transistor. As is known per se, the source and drain contacts may also be produced by a process that self-aligns relative to caps formed on the gate stacks.

Figure 39:
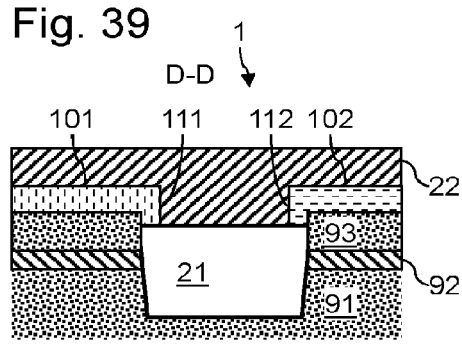

FIG. 39 illustrates a cross-sectional view level with nMOS and pMOS transistor drains. The overruns 111 and 112 of the layers 101 and 102 onto the trench isolation 21 are preserved.

The invention makes it possible to prevent short circuits from forming between the epitaxial source/drain depositions of transistors of a given row, without however requiring facets to be formed. The current density able to be passed by the formed sources and drains is optimal. Moreover, it is possible to produce both sources and drains that have both relatively large thicknesses (in order to limit the risk of formation of separate nodules and to allow on-state resistance to be decreased) and a channel of small thickness (in order to improve short-channel effects).

The invention makes it possible to preserve the overruns onto the trench isolations 21 of the epitaxial depositions included in the sources and drains of the transistors, without however running the risk of creating short-circuits plumb with these trench isolations 21 (even when these trench isolations 21 have a small width) or increasing leakage and the active layer 93 level.

Figure 40:
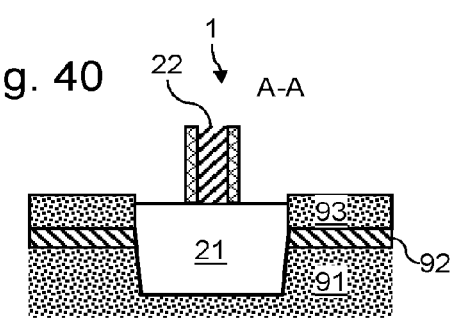
FIGS. 40 to 42 illustrate various steps of one variant process for fabricating field-effect transistors according to the first embodiment of the invention.
Figure 41:
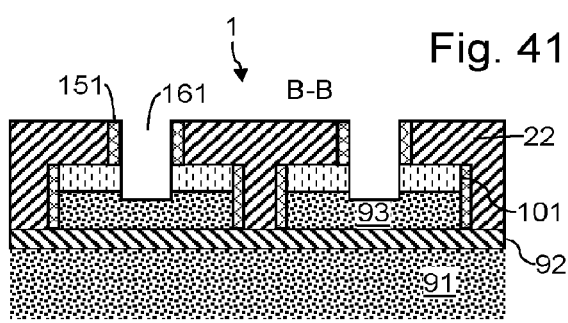
Figure 42:
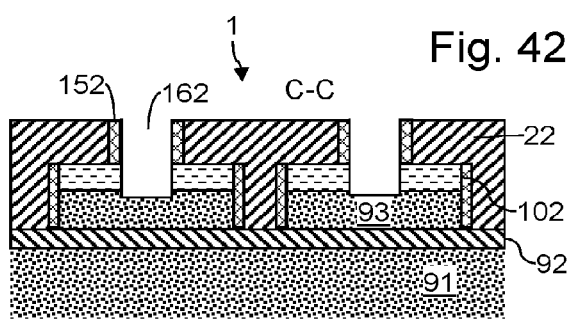

FIGS. 40 to 42 illustrate a step of the process according to one variant. Relative to the stage illustrated in FIGS. 23 to 25, the grooves 161 and 162 are deepened by partial etching of the active layer 93. The active layer 93 will possibly for example be etched to a depth comprised between 2 and 10 nm, before a gate insulating layer is deposited. According to such a variant, it is possible to even further decrease the thickness of the channel of the formed transistor while starting with a thicker active layer 93, in order to limit the risk of defects in such an active layer 93. The partial etching of the active layer 93 may be carried out by RIE (reactive ion etching) or chemical etching or by oxidation then deoxidation of the active layer 93. In particular, with chemical etching, the etching will possibly advantageously be stopped on certain crystal planes, in order to allow the shape and etching depth to be controlled.

According to one improvement of this variant, after the active layer 93 has been etched in the grooves 161 and 162, a lightly doped semiconductor may be deposited at the bottom of the grooves 161 and 162. Such a deposit is intended to belong to the channel of the transistor, in order to obtain a lightly doped channel that will not be degraded by any diffusion of dopants originating from the layers 101 and 102 and to improve the electrical properties of the transistors.

FIGS. 43 to 60 illustrate another embodiment of a process for fabricating field-effect transistors of an integrated circuit 1. According to this variant, it is possible advantageously to preserve mechanical strains along a single axis in initially pre-strained channels, this being favourable for the performance of the obtained transistors. As for the first embodiment, for the sake of simplicity, the formation of a single transistor for each of the formed islands has been illustrated. A plurality of adjoined transistors may of course be formed in each of the islands.

Figure 44:
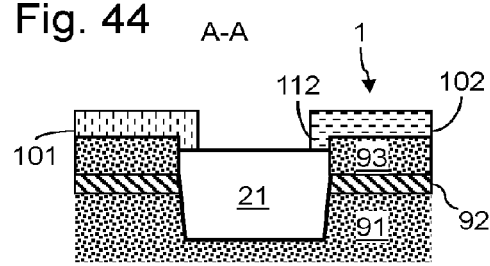
Figure 43:
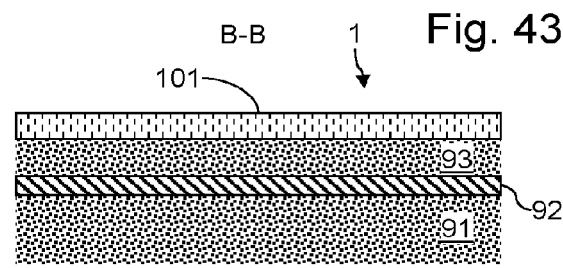
Figure 45:
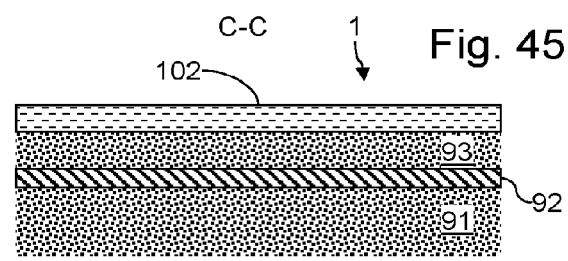

At the stage illustrated in FIGS. 43 to 45, a structure corresponding substantially to that of FIGS. 4 and 5 has been provided. This structure includes a semiconductor substrate 91, a buried insulating layer 92 and an active layer 93 that is separated from the substrate 91 by the buried insulating layer 92. The layer 93 includes semiconductor bands separated by trench isolations 21. The substrate 91, the layer 92 the bands of the layer 93 and the trench isolations 21 may have the same characteristics as those described for the first embodiment with reference to FIGS. 1 to 5. The trench isolations 21 may be formed before or after the layers 101 and 102 are formed.

Figure 46:
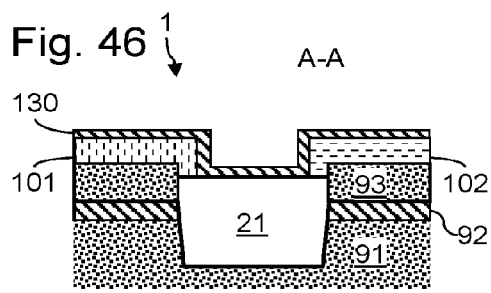
Figure 47:
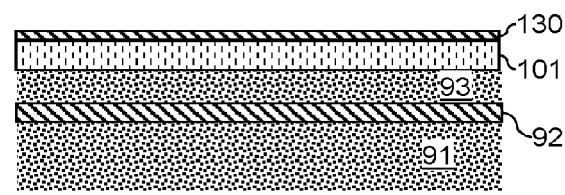

At the stage illustrated in FIGS. 46 and 47, the formation of the sacrificial gates is initiated. Here, a dielectric layer 130 is deposited on the wafer scale. Similar deposition processes to those described for the first embodiment may be used. The dielectric layer 130 may have the same properties as those described with reference to the first embodiment. The dielectric layer 130 thus covers the layers 101 and 102. The layer 130 is also deposited on the upper face of the trench isolation 21 between the row of nMOS transistors and the row of pMOS transistors.

Figure 48:
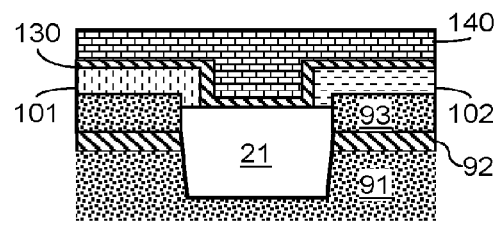
Figure 49:
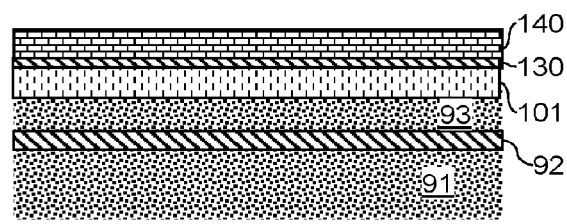

At the stage illustrated in FIGS. 48 and 49, the formation of the sacrificial gates has progressed. Here, a layer 140 has been deposited on the wafer scale on the layer 130. The layer 140 may be produced from a single material (for example silicon nitride $Si_xN_yH_z$) or may include a superposition of various layers, for example a layer of silicon nitride $Si_xN_yH_z$ on a thin oxide layer $Si_xO_yH_z$, or a cap of nitride $Si_xN_yH_z$ on polysilicon. Processes for depositing the layer 140 are known per se to those skilled in the art.

Figure 50:
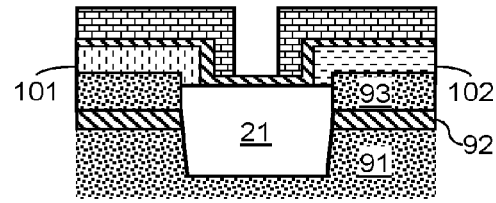
Figure 51:
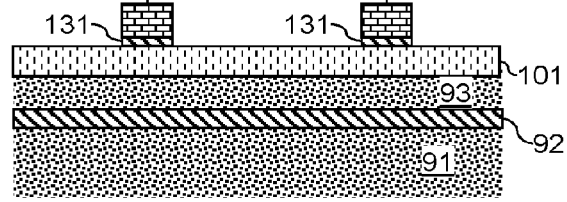
Figure 52:
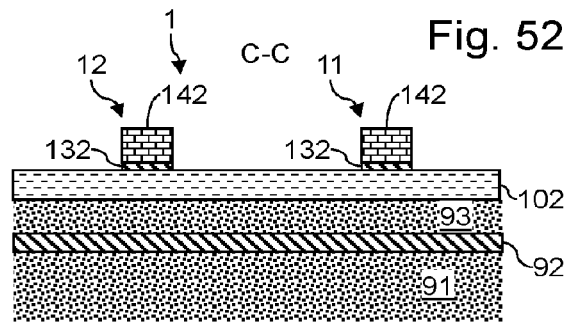

At the stage illustrated in FIGS. 50 to 52, the patterns of the sacrificial gates 11 and 12 have been defined on the layers 101 and 102 in a way known per se. The definition of the patterns of the sacrificial gates is known per se by those skilled in the art and may for example be carried out by photolithography.

Sacrificial gates 11 are thus obtained for the nMOS transistors by superposing layers 131 and 141 issued from the layers 130 and 140, respectively. Sacrificial gates 12 are also obtained for the pMOS transistor by superposing layers 132 and 142 issued from the layers 130 and 140, respectively.

Figure 53:
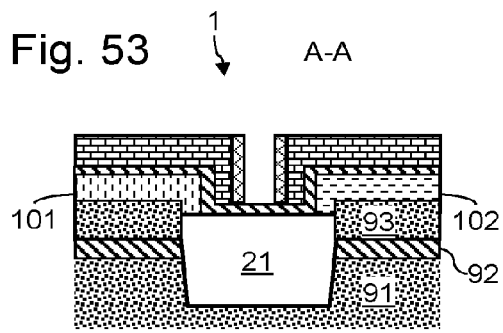
Figure 54:
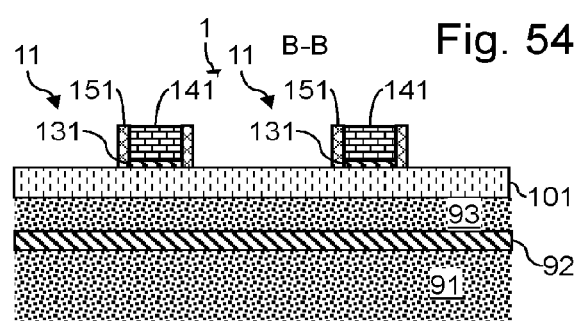
Figure 55:
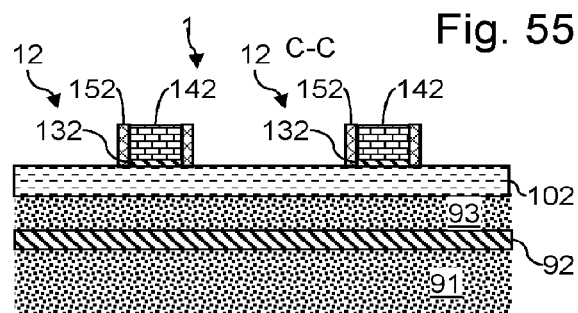

At the stage illustrated in FIGS. 53 to 55, a dielectric layer has been deposited, typically by wafer-scale deposition. This dielectric layer is for example deposited by an ALD process. This dielectric layer is especially deposited on the lateral faces of the various sacrificial gates 11 and 12. This dielectric layer for example has the same properties as those described with reference to FIGS. 15 to 17.

By etching, this dielectric layer has been removed so as to expose the layers 101 and 102 on either side of the sacrificial gates 11 and 12. Spacers 151 and 152 are preserved on the lateral faces of the sacrificial gates 11 and 12, respectively. Such a removal of this dielectric layer so as to obtain these spacers is for example implemented with an anisotropic etch.

Figure 56:
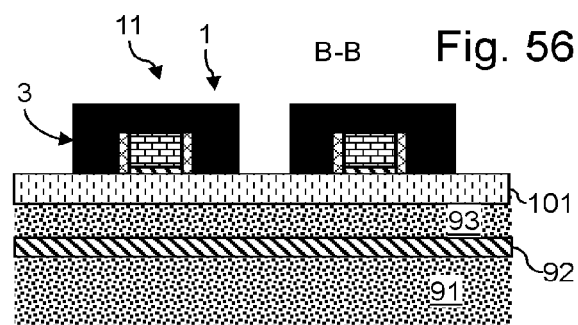
Figure 57:
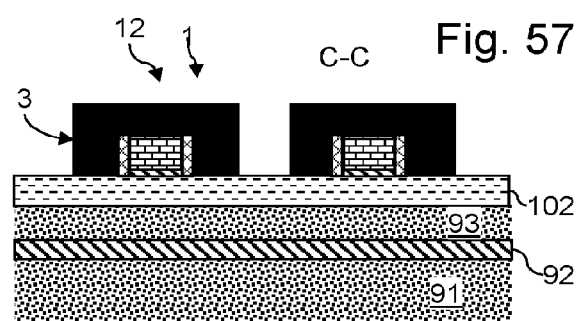

At the stage illustrated in FIGS. 56 and 57, a mask 3 has been applied to the islands to be formed.

At the stage illustrated in FIGS. 58 to 60, a mesa type isolation has been produced between the transistors to be formed in each of the zones 81 to 84. The islands intended to form nMOS transistors in a row are separated by grooves 121. The islands intended to form pMOS transistors in an adjacent row are separated by grooves 122.

The formed grooves 121 and 122 here stop before passing through the buried insulating layer 92, the grooves 121 and 122 are necessarily shallower than the trench isolation 21.

Steps identical to those described with reference to FIGS. 18 to 39 may then be implemented, in order to progress the formation of the transistors, including the removal of the sacrificial gates 11 and 12, the etching of the layers 101 and 102 at the bottom of the grooves 161 and 162, optionally the formation of additional spacers in the grooves 161 and 162, the formation of the gate insulator and the gate of the transistors, and the formation of interconnect contacts for the source, drain and gate of each of the transistors.

In this embodiment, the formation of the trench isolations 21 allows a one-dimensional relaxation at the edge of the active layer 93 of an island. Generally, the presence of the sacrificial gates 11 and 12 on the layers 101 and 102 during the definition of the islands in contrast makes it possible to ensure a mechanical rigidity above the channel of the transistors in the direction of the row, this possibly allowing a tensile or compressive pre-strain to be maintained in the active layer 93 of the islands, in the direction of these rows (this direction therefore being collinear with a median plane of the layer 101 or 102, as applicable). A unidirectional pre-strain may thus be preserved over the width of the channel zones of the formed transistors, when the etching step used to separate the bands into islands is carried out after the sacrificial gates have been formed. Such a pre-strain makes it possible to improve the electrical performance of these transistors. Such a pre-strain may be generated as is known per se by adjoining semiconductors having quite different lattice parameters, for example silicon superposed on a silicon-germanium alloy with a germanium concentration at least equal to 20%. In particular, the epitaxial growth of one of the two materials on the other of these two materials allows a pre-strain to be induced in that one of these two materials used to form the channel zone of the transistors.

Although the invention was illustrated in the context of an isolation between a row of nMOS transistors relative to a row of pMOS transistors, it of course applicable to the isolation of rows of transistors of the same type.

Although the formation of rows of islands was described with a process for etching separating grooves not passing through the buried insulating layer 92, it is also possible to envision continuing such an etch into the substrate 91, so as to form grooves with a depth smaller than that of the trench isolations 21.

In the case where the islands include a plurality of transistors, transistor gates that are not necessarily functional may be formed at the ends of the islands in the direction of the rows. In such a case, for the sake of compactness, a (non-functional) gate may possibly be obtained directly at the ends of the island.

The invention claimed is:

1. A process for fabricating field-effect transistors, comprising:

providing a first semiconductor band extending in a first direction and surmounted with a first semiconductor layer having a resistivity lower than that of the first band;

providing a second semiconductor band extending in the first direction and surmounted with a second semiconductor layer having a resistivity lower than that of the second band;

providing a buried insulating layer insulating a semiconductor substrate from said first and second semiconductor bands;

providing a deep trench isolation passing through said buried insulating layer and isolating said first semiconductor band from said second semiconductor band;

etching the first semiconductor band and the first semiconductor layer in a second direction perpendicular to the first direction so as to form a first row of semiconductor islands that are isolated from one another;

etching the second semiconductor band and the second semiconductor layer in said second direction so as to form a second row of semiconductor islands that are isolated from one another, said etches being carried out to a depth smaller than that of the deep trench isolation;

forming sacrificial gates on said first semiconductor layer and on said second semiconductor layer;

forming spacers on either side of said sacrificial gates;

encapsulating the sacrificial gates in an insulator;

removing said sacrificial gates in order to form grooves between said spacers in said insulator;

removing the first semiconductor layer and the second semiconductor layer at the bottom of said grooves so as to reach said first and second semiconductor bands, respectively; and then forming gates between said spacers in said grooves.

2. The process for fabricating field-effect transistors according to claim 1, wherein said etching of the first and second semiconductor bands is interrupted before said buried insulating layer is passed through.

3. The process for fabricating field-effect transistors according to claim 1, wherein said etching of the first and second semiconductor bands is carried out so as to produce trenches of a width of at most 90 nm between the islands of the first row and between the islands of the second row.

4. The process for fabricating field-effect transistors according to claim 1, wherein said sacrificial gates are formed after the first and second rows of semiconductor islands have been formed.

5. The process for fabricating field-effect transistors according to claim 1, wherein said sacrificial gates are formed on the first and second semiconductor layers before the first and second rows of semiconductor islands are formed.

6. The process for fabricating field-effect transistors according to claim 5, wherein said first and second semiconductor bands are pre-strained.

7. The process for fabricating field-effect transistors according to claim 1, further comprising partially removing said first and second semiconductor bands at the bottom of said grooves.

8. The process for fabricating field-effect transistors according to claim 1, further comprising forming additional spacers in said grooves after said sacrificial gates have been removed.

9. The process for fabricating field-effect transistors according to claim 1, wherein said provided first and/or second semiconductor bands are made of silicon or silicon alloys.

10. The process for fabricating field-effect transistors according to claim 1, wherein the process is devoid of a step of forming deep trench isolations between said islands of said rows.

11. The process for fabricating field-effect transistors according to claim 1, wherein said provided first and second semiconductor bands have a thickness comprised between 3 and 15 nm.

12. The process for fabricating field-effect transistors according to claim 1, wherein said provided first and second semiconductor layers have a thickness comprised between 2 and 10 nm.

13. The process for fabricating field-effect transistors according to claim 1, wherein the material of the provided first semiconductor layer is chosen from the group comprising Si, SiCP, Si doped with arsenic or phosphorus, strained Si, InGaAs, InAs and InSb, and wherein the material of the provided second semiconductor layer is chosen from the group comprising SiGeB, SiGe, Ge, GeSn, InSb and B-doped Si, or Si.

14. The process for fabricating field-effect transistors according to claim 5, wherein the superposition of the first semiconductor band and the first semiconductor layer is configured to induce a tensile or compressive strain in the plane of the first semiconductor band, and wherein the superposition of the second semiconductor band and the second semiconductor layer is configured to induce a tensile or compressive strain in the plane of the second semiconductor band.

15. The process for fabricating field-effect transistors according to claim 1, wherein the provided first semiconductor layer and the provided second semiconductor layer each have an overrun plumb with said deep trench isolation.

16. The process for fabricating field-effect transistors according to claim 15, wherein the encapsulation of said sacrificial gates in said insulator includes the deposition of this insulator on said deep trench isolation, said deposition of insulator separating the overrun of the first semiconductor layer and the overrun of the second semiconductor layer.

17. The process for fabricating field-effect transistors according to claim 16, wherein:
the formation of the sacrificial gates includes deposition of a sacrificial-gate material between the respective overruns of the first and second semiconductor layers, and a step of etching the pattern of the sacrificial gates, the etching of the pattern of the sacrificial gates including forming a groove through said deposition of a sacrificial-gate material, said groove being formed between the respective overruns of the first and second semiconductor layers; and
the formation of the spacers on either side of said sacrificial gates includes deposition of spacer material on the faces of the groove formed between said overruns.

18. The process for fabricating field-effect transistors according to claim 17, wherein said step of encapsulating sacrificial gates in an insulator includes depositing this insulator in the groove formed between said overruns and against the spacer material deposited in this groove.

* * * * *